(12) United States Patent
Ogura (10) Patent No.: US 12,510,421 B2
(45) Date of Patent: Dec. 30, 2025

(54) ELECTRONIC COMPONENT, LEAD PART CONNECTION STRUCTURE, AND LEAD PART CONNECTION METHOD

(71) Applicant: SEMITEC Corporation, Tokyo (JP)

(72) Inventor: Mitsutoshi Ogura, Tokyo (JP)

(73) Assignee: SEMITEC Corporation, Tokyo (JP)

( * ) Notice: Subject to any disclaimer, the term of this patent is extended or adjusted under 35 U.S.C. 154(b) by 620 days.

(21) Appl. No.: 17/909,758

(22) PCT Filed: Mar. 17, 2021

(86) PCT No.: PCT/JP2021/010810
§ 371 (c)(1),
(2) Date: Sep. 7, 2022

(87) PCT Pub. No.: WO2021/200154
PCT Pub. Date: Oct. 7, 2021

(65) Prior Publication Data
US 2023/0093829 A1  Mar. 30, 2023

(30) Foreign Application Priority Data
Mar. 31, 2020  (JP) .................. 2020-064180

(51) Int. Cl.
*G01K 7/22* (2006.01)
*B23K 11/16* (2006.01)
(Continued)

(52) U.S. Cl.
CPC ............... *G01K 7/22* (2013.01); *B23K 11/16* (2013.01); *H01R 4/023* (2013.01); *B23K 2101/38* (2018.08)

(58) Field of Classification Search
None
See application file for complete search history.

(56) References Cited

U.S. PATENT DOCUMENTS

2020/0249097 A1* 8/2020 Ogura ...................... G01K 7/22

FOREIGN PATENT DOCUMENTS

CN  101607343  12/2009
CN  108879131  11/2018
(Continued)

OTHER PUBLICATIONS

"International Search Report (Form PCT/ISA/210) of PCT/JP2021/010810", mailed on Jun. 8, 2021, with English translation thereof, pp. 1-4.
(Continued)

*Primary Examiner* — Erica S Lin
(74) *Attorney, Agent, or Firm* — JCIPRNET (57) ABSTRACT

Provided are an electronic component, a lead part connection structure, and a lead part connection method which can reduce damage of a lead part and improve joint strength. In this lead part connection structure, a lead part (3) made of a conductor and a conductive wire (5) made of a plurality of core wires (52) are connected to each other through welding, wherein the lead part (3) and the conductive wire (5) are connected to each other through welding in a condition in which the lead part (3) is fitted into the plurality of core wires (52) of the conductive wire (5). In the conductive wire (5), the core wires (52) are not integrated with each other in advance through welding.

11 Claims, 10 Drawing Sheets

(51) Int. Cl.
*H01R 4/02* (2006.01)
*B23K 101/38* (2006.01)

(56) References Cited

FOREIGN PATENT DOCUMENTS

| | | |
|---|---|---|
| EP | 2337650 | 6/2011 |
| JP | 862265703 | 11/1987 |
| JP | H06215851 | 8/1994 |
| JP | 2013068610 | 4/2013 |
| JP | 2015232552 | 12/2015 |
| JP | 2016083671 | 5/2016 |
| WO | 2018173264 | 9/2018 |
| WO | 2019087755 | 5/2019 |

OTHER PUBLICATIONS

"Office Action of China Counterpart Application", issued on May 23, 2025, with English translation thereof, p. 1-p. 22.

* cited by examiner

ELECTRONIC COMPONENT, LEAD PART CONNECTION STRUCTURE, AND LEAD PART CONNECTION METHOD

CROSS-REFERENCE TO RELATED APPLICATION

This application is a 371 application of the International PCT application serial no. PCT/JP2021/010810, filed on Mar. 17, 2021, which claims the priority benefits of Japan Patent Application No. 2020-064180, filed on Mar. 31, 2020. The entirety of each of the above-mentioned patent applications is hereby incorporated by reference herein and made a part of this specification.

TECHNICAL FIELD

The invention relates to an electronic component, a lead part connection structure, and a lead part connection method.

RELATED ART

In the conventional art, for example, a lead part (lead wire) connected to a thermistor element and led out from the thermistor element is connected to a conductive wire (twisted wire) formed by multiple core wires through welding. In such case, during welding, it is necessary to prevent the core wires from being scattered which makes it difficult to perform bonding properly. Therefore, the core wires in the twisted wire are compacted by welding in advance, and the core wires are solidified and integrated through pressing and heat molding. After being compacted, the lead wire and the twisted wire are bonded by resistance welding (see, for example, Patent Document 1).

However, at the time of bonding the lead wire and the twisted wire, since the twisted wire has been integrated, the pressure by pressing may be concentrated on the lead wire, and the damage received by the lead wire may be significant.

Meanwhile, a bonding method which welds multiple core wires and a lead part (terminal) by compressing from two axial directions and fits the core wires to a terminal width has been proposed (see Patent Document 4).

However, in such case, an issue that it is difficult to attain sufficient strength of the bonding part occurs.

Also, there is a type of surface temperature measurement sensor covering a thermistor element by using a cover layer formed by a pair of sheet-like resin materials. Although such sensor is suitable for measuring the surface temperature of an object under temperature measurement, an issue may arise that, as the thickness of the bonding part between a lead wire and a conductive wire increases, the temperature measurement accuracy and the responsiveness decrease.

CITATION LIST

Patent Literature

[Patent Literature 1] Japanese Laid-open No. 2013-68610
[Patent Literature 2] Japanese Laid-open No. 2015-232552
[Patent Literature 3] International Publication No. WO2018/173264
[Patent Literature 4] Japanese Laid-open No. 2016-83671
[Patent Literature 5] European Patent No. 2337650

SUMMARY OF INVENTION

Technical Problem

The embodiments of the invention have been made in view of the above, and an objective is to provide an electronic component, a lead part connection structure, and a lead part connection method capable of reducing damage of a lead part and facilitating bonding strength.

Solution to Problem

A lead part connection structure according to an embodiment of the invention connects a lead part formed by a conductor and a conductive wire formed by a plurality of core wires by welding.

The lead part and the conductive wire are connected by welding in a state in which the lead part is entered into the core wires of the conductive wire.

According to the embodiment, the damage of the lead part can be reduced, and the bonding strength can be facilitated. In addition, as the thickness of the bonding part between the lead part and the conductive wire through welding can be reduced, for example, in the case where the lead part connection structure is suitable for a temperature sensor, the temperature measurement accuracy and the responsiveness can be facilitated. Moreover, compared with soldering, the bonding through welding has a higher heat-resistant temperature.

An electronic component according to an embodiment of the invention includes an electronic component element and the lead part connected with the electronic component element. The electronic component has the lead part connection structure.

In addition, in a lead part connection method according to an embodiment of the invention, a lower electrode and an upper electrode are provided, a mounting space of a material to be welded is formed on a side of the lower electrode, and the material to be welded is a lead part formed by a conductor and a conductive wire formed from a plurality of core wires. The core wires are not integrated by welding in advance. The lead part connection method includes: in a state in which the conductive wire and the lead part on or in the conductive wire are mounted in the mounting space, pressing and heating the lead part and the conductive wire by using the lower electrode and the upper electrode to bond the lead part and the conductive wire through welding.

Effects of Invention

According to the embodiments of the invention, the electronic component, the lead part connection structure, and the lead part connection method capable of reducing the damage to the lead part and facilitating bonding strength can be provided.

BRIEF DESCRIPTION OF DRAWINGS (a) and (b) of FIG. 1 illustrate a temperature sensor according to a first embodiment of the invention, where (a) of FIG. 1 is a plan view, and (b) of FIG. 1 is a cross-sectional view taken along a line Y-Y.

(a) to (d) of FIG. 2 illustrate connection states between a lead part and a conductive wire in the same temperature sensor, where (a) of FIG. 2 is a side view before welding, (b) of FIG. 2 is a cross-sectional view taken along the line Y-Y, (c) of FIG. 2 is a side view after welding, and (d) is a cross-sectional view taken along the line Y-Y.

(a) and (b) of FIG. 4 are views illustrating a lead part connection method for the same temperature sensor.

(a) and (b) of FIG. 5 are views illustrating a connection method and a connection structure of the same lead part, where (a) of FIG. 5 illustrates a state before welding of the lead part, and (b) of FIG. 5 illustrates a state after welding of the lead part.

(a) and (b) of FIG. 6 illustrate a relationship between a thickness dimension of the lead part and a breaking strength, where (a) of FIG. 6 is a photo illustrating a bonding part of the lead part, and (b) of FIG. 6 is a graph illustrating the relationship between the thickness dimension of the lead part and the breaking strength.

(a) to (e) of FIG. 7 are views illustrating modified examples for the connection structure of the lead part.

(a) and (b) of FIG. 8 illustrate a temperature sensor according to a second embodiment of the invention, where (a) of FIG. 8 is a plan view, and (b) of FIG. 8 is a cross-sectional view taken along the line Y-Y.

(a) and (b) of FIG. 9 are views illustrating a lead part connection method for the same temperature sensor.

(a) to (f) of FIG. 11 are views illustrating modified examples for the connection structure of the lead part.

(a) and (b) of FIG. 12 illustrate connection structures of the lead part in the embodiment in comparison with a comparative example, where (a) of FIG. 12 is a view illustrating the comparative example, and (b) of FIG. 12 is a view illustrating the embodiment.

(a) and (b) of FIG. 13 illustrate a temperature sensor as an electronic component having the lead part connection structure, where (a) is a perspective view, and (b) is a cross-sectional view take along the line Y-Y.

DESCRIPTION OF EMBODIMENTS

In the following, an electronic component and a lead part connection structure according to the first embodiment of the invention are described with reference to (a) and (b) of FIG. 1 and (a) to (d) of FIG. 2. In the respective figures, the same or equivalent parts are labeled with the same reference symbols, and repeated descriptions are omitted. Also, in the respective figures, the scales of the respective components may be changed as appropriate for the purpose of description. (a) and (b) of FIG. 1 illustrate a temperature sensor as an electronic component, and (a) to (d) of FIG. 2 illustrate connection states between a lead part and a conductive wire.

Figure 1:
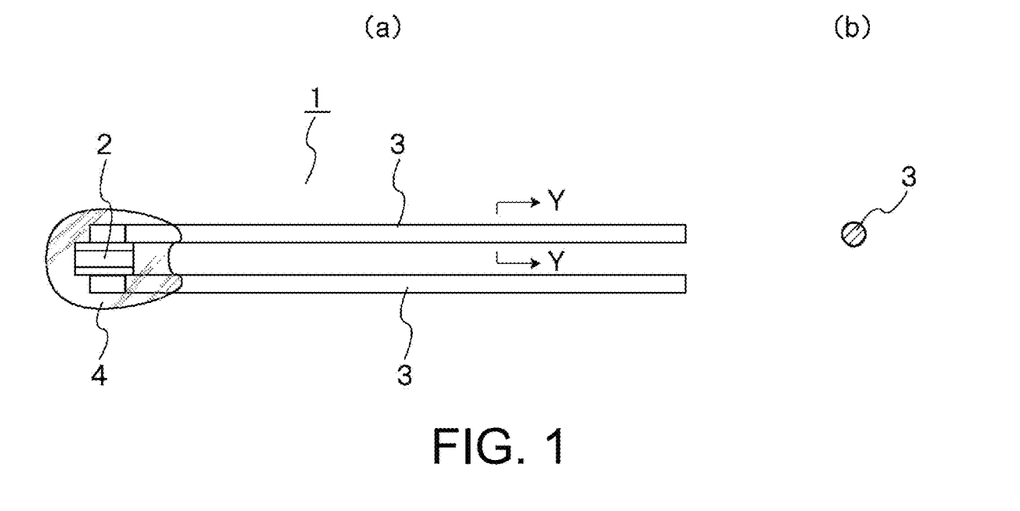
Figure 2:
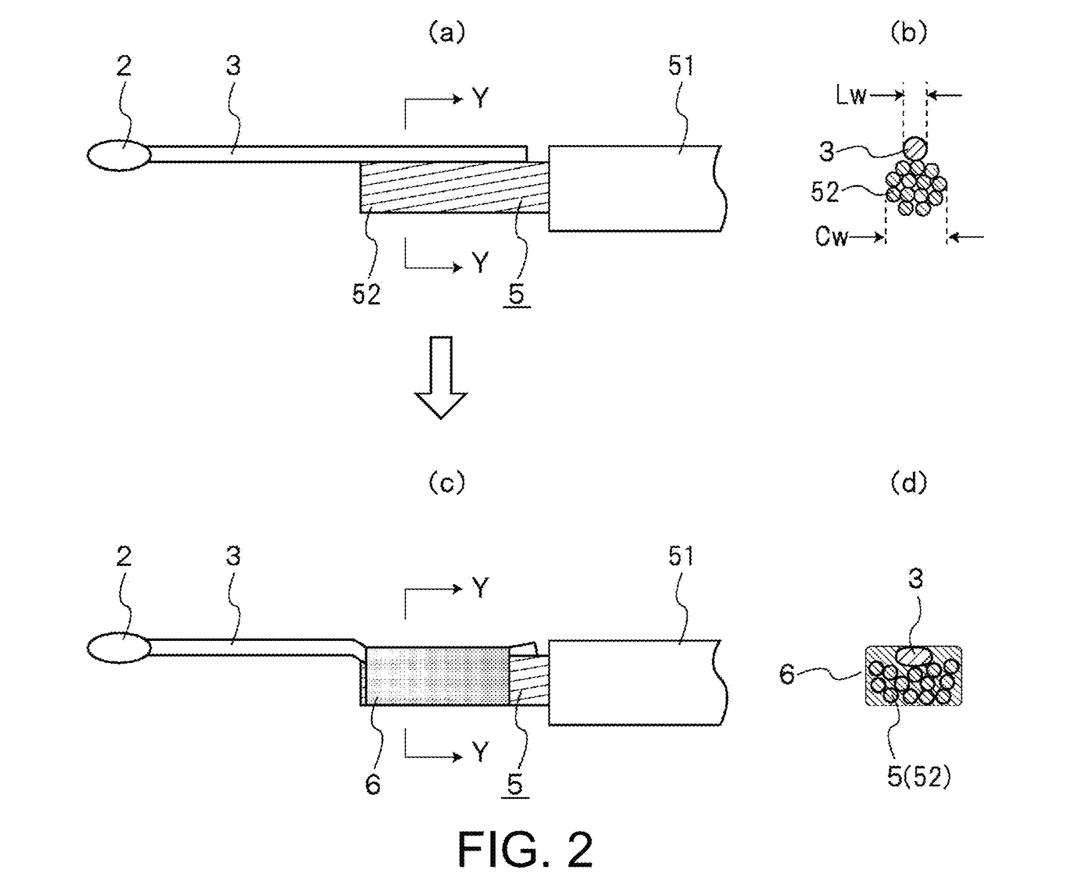

As shown in (a) of FIG. 1, a temperature sensor 1 as the electronic component includes a thermistor element 2, which is an electronic component element, and a lead wire 3, which is the lead part connected with the thermistor element 2.

The thermistor element 2 is a temperature sensitive sintering of a thermistor sintered body, formed by two or more elements selected from transition metal elements such as manganese (Mn), nickel (Ni), cobalt (Co), iron (Fe), yttrium (Y), chromium (Cr), copper (Cu), zinc (Zn), etc., and formed by a thermistor material of an oxide including, as a main ingredient, a composite metal oxide having a crystal structure. Sub-ingredients may also be provided for facilitating properties, etc. The composition and contents of the main ingredient and the sub-ingredients can be determined as appropriate in accordance with desired properties.

In addition, the thermistor element 2 is covered by a sealing material 4, such as glass. Accordingly, even when the temperature sensor 1 is used in a high-temperature environment, the thermistor element 2 can be effectively protected.

The lead wire 3 is a pair of circular wires (see (b) of FIG. 1) having a conductive property and having a cross-section in a circular shape, and is electrically connected to an electrode of gold, silver, copper, and platinum, etc., formed on the surface of the thermistor element 2 by welding or soldering and led out from the sealing material 4 such as glass. As the lead wire 3, a dumet wire formed by a single conductive wire may be used. As the material of the lead wire 3, alloy 42, copper (Cu), iron (Fe), chromium (Cr), nickel (Ni), aluminum (Al), zinc (Zn), titanium (Ti), or an alloy containing at least one of the aforementioned can be used.

As shown in (a) to (d) of FIG. 2, the lead wire 3 is electrically connected to a conductive wire 5. The conductive wire 5 is an electric wire formed by a twisted wire covered by an insulating cover 51, and is formed by multiple core wires 52. Each of the core wires 52 is electrically connected to the lead wire 3 by bonding through welding.

In (a) of FIG. 2, a state in which the lead wire 3 is disposed on the conductive wire 5 before the lead wire 3 and the conductive wire 5 are welded is shown. In such state, the respective core wires 52 of the conductive wire 5 are not welded in advance. The core wires 52 that are not integrated are scattered, and in a state that can be separated. In (b) of FIG. 2, a cross-section before the lead wire 3 and the conductive wire 5 are welded is shown. In addition, in (c) of FIG. 2, a state after the lead wire 3 and the conductive wire 5 are welded by pressing and heating. The rear end side of the lead wire 3 and the tip end side of the conductive wire 5 are welded and bonded, and a bonding part 6 is formed. (d) of FIG. 2 schematically illustrates a cross-section of the bonding part 6.

As shown in (d) of FIG. 2, in the bonding part 6, the lead wire 3 is welded in a state of being entered into the core wires 52 of the conductive wire 5. Specifically, a portion of the outer periphery in the cross-section of the lead wire 3, that is, except for the upper part, the bottom part side and two lateral part sides in the cross-section of the lead wire 3 are embedded and entered into the core wires 52 that are welded. It is noted that the lead wire 3 may also be welded in a state in which the entire periphery in the cross-section of the lead wire 3 is entered into the core wires 52 of the conductive wire 5.

According to the connection structure of such lead wire 3 as the lead part, with the lead wire 3 being embedded into the core wires 52 of the conductive wire 5, the strength of the bonding part 6 against thermal impact or external force can be facilitated. It is noted that the electronic component is not limited to a temperature sensor, and various semiconductor components can be used as the electronic component.

Figure 3:
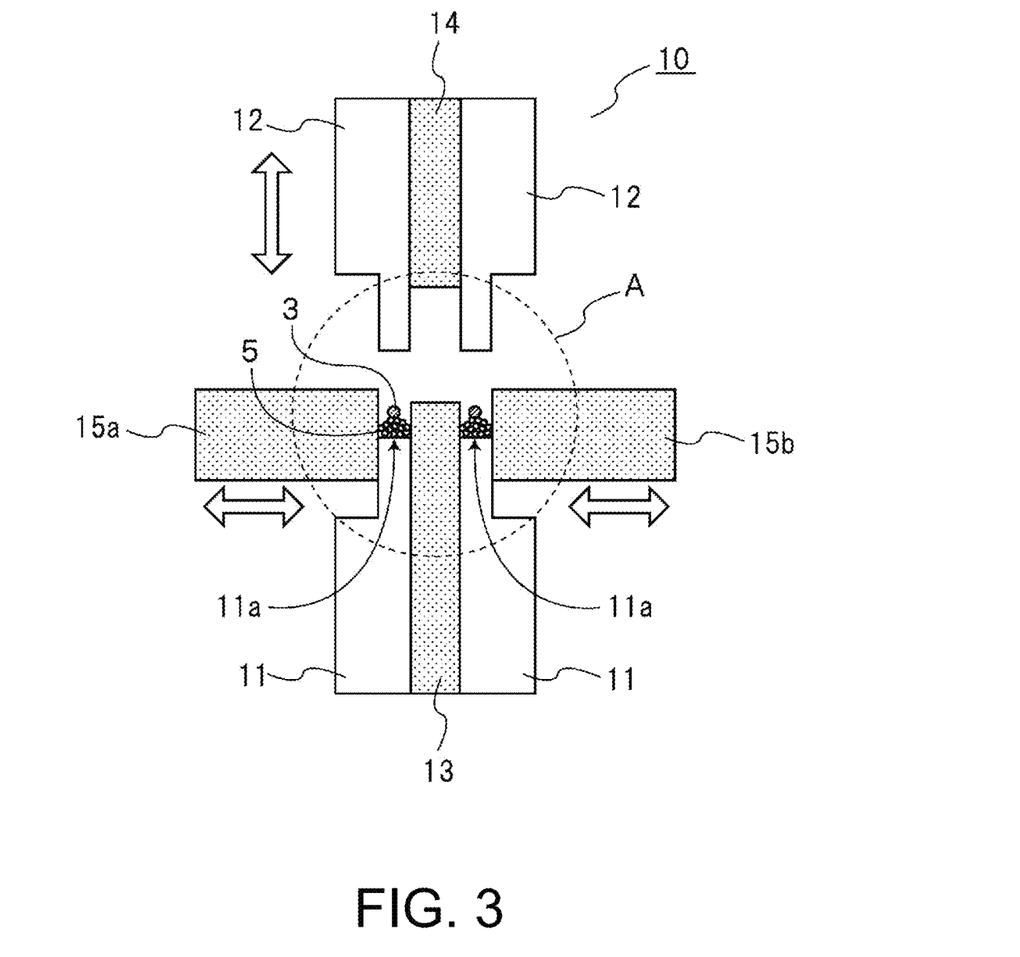
FIG. 3 is a view schematically illustrating a configuration of a resistance welding apparatus.
Figure 4:
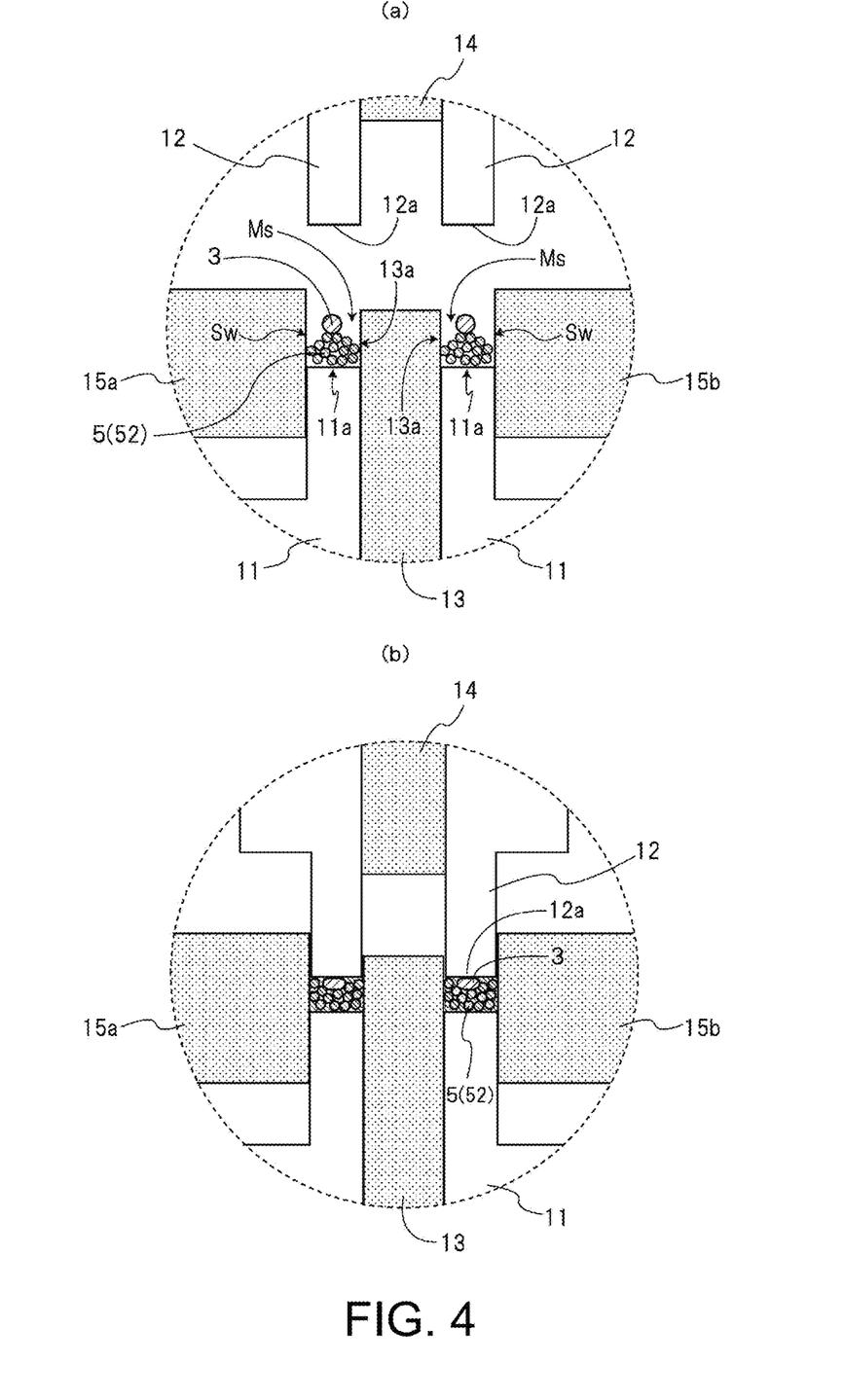

Then, a lead part connection method of the embodiment is described with reference to FIGS. 3 to 6. FIG. 3 is a view schematically illustrating a configuration of a resistance welding apparatus, and (a) and (b) of FIG. 4 illustrate the lead part connection method. In addition, FIG. 5 includes views illustrating the lead part connection method and a lead part connection structure according to the embodiment. (a) of FIG. 6 is a photo of a sample illustrating the lead part connection structure according to the embodiment.

The resistance welding apparatus 10 as shown in FIG. 3 serves to bond a pair of the lead wires 3 to the conductive wires 5 by pressing and heating, and includes lower electrodes 11, upper electrodes 12, an insulating member 13 of the lower electrodes, an insulating member 14 of the upper electrodes, and lateral part guide members 15a and 15b.

The lower electrode 11 is a cathode electrode formed by tungsten, and a mounting surface 11a that is flat and serves to mount the conductive wire 5 along the axial direction is formed on the upper side. In addition, the insulating member 13 of the lower electrode is formed by a ceramic material, and ensures the insulating properties of the pair of lower electrodes 11. The pair of lower electrodes 11 and the insulating member 13 are integrated and form a fixed side.

The lateral part guide members 15a and 15b are formed by a ceramic material having an insulating property, disposed on two sides of the lower electrodes 11, and are drivable in the lateral direction, that is, the left-right direction.

In addition, as shown in (a) and (b) of FIG. 4, in a state in which the lateral part guide members 15a and 15b are driven to the side of the lower electrodes 11, groove-like mounting spaces Ms are formed among the mounting surfaces 11a of the lower electrodes 11, sidewalls Sw of the lateral part guide members 15a and 15b, and sidewalls 13a on the upper side of the insulating member 13 of the lower electrode. The mounting space Ms is a space part for mounting the conductive wire 5 and the lead wire 3 disposed on the conductive wire 5 as materials to be welded. Specifically, the mounting space Ms is formed by the mounting surface 11a that is flat as a bottom wall and two side walls Sw and 13a standing upright from the bottom wall. Therefore, the width dimension of the bottom wall in the mounting space Ms remains substantially the same to the top.

As described above, with the lower electrodes 11, the insulating member 13, and the side guide members 15a and 15b, the mounting spaces Ms are formed, and a lower mold of the fixed side is formed. In other words, the mounting spaces Ms are formed in the lower mold on the side of the lower electrodes 11.

The upper electrodes 12 are anode electrodes on the driving side, and are driven in the longitudinal direction, that is, up-down direction. Like the lower electrode 11, the upper electrode 12 is formed by tungsten. The insulating material 14 of the upper electrode is formed by a ceramic material, and the pair of upper electrodes 12 and the insulating member 14 are integrated. In addition, a pressing part having a pressing surface 12a that is flat is formed on the lower side of the upper electrode 12. Specifically, the width dimension of the pressing part is formed to be slightly smaller than the width dimension of the mounting space MS, and the pressing part can be inserted into the mounting space Ms.

With the upper electrodes 12 and the insulating material 14 as the above, an upper mold on the driving side is formed.

Then, an order of bonding and connecting the lead wire 3 to the conductive wire 5 is described with reference to (a) and (b) of FIG. 4. (a) and (b) of FIG. 4 are views illustrating a necessary portion A of the connection structure of the lead wire 3 in FIG. 3 enlarged for illustration. In the embodiment, the conductive wires 5 and the lead wires 3 are disposed on the side of the lower electrodes 11 forming the lower mold, and are pressed and welded by the side of the upper electrodes 12 forming the upper mold.

As shown in (a) of FIG. 4, (1) the conductive wires 5 formed by the core wires 52 are disposed on the mounting surfaces 11a of the lower electrodes 11. In such state, the respective core wires 52 of the conductive wire 5 are not welded in advance. Since the core wires 52 are not integrated, the core wires 52 are in a state that can be separated.

In addition, at this stage, the lateral part guide members 15a and 15b are located apart from the lower electrodes 11. (2) Then, the lead wires 3 are mounted on the core wires 52. (3) The lateral part guide members 15a and 15b are driven and moved inward, that is, toward the sides of the lower electrodes 11. In this state, the mounting spaces Ms are formed, and the core wires 52 of the conductive wires 5 are in the state that can be separated. However, the spreading in the lateral direction is limited by the width dimension of the mounting space Ms. In addition, it is needless to say that the width dimension of the mounting space Ms is larger than the width dimension (diameter dimension) of the cross-section of the lead wire 3.

As shown in (b) of FIG. 4, (4) in the state in which the conductive wires 5 and the lead wires 3 are disposed in the mounting spaces Ms, the upper electrodes 12 are driven to be lowered, and the lead wires 3 and the conductive wires 5 are pressed by the pressing surfaces 12a of the upper electrodes 12. (5) With the pressing as well as the upper electrodes 12 and the lower electrodes 11 being powered, the lead wires 3 and the conductive wires 5 are heated and connected by bonding through welding. (6) Afterwards, the upper electrodes 12 are driven to rise, the lateral part guide members 15a and 15b are driven outward, that is, driven to a direction away from the lower electrodes 11, the upper electrodes 12 and the lateral part guide members 15a and 15b respectively return to initial positions, and the welded lead wires 3 and conductive wires 5 are taken out.

Accordingly, the connection between the lead wire 3 and the conductive wire 5 is completed. The above connection order can be changed as appropriate. It is noted that the insulating member 13 of the lower electrode, the lateral part guide members 15a and 15b, and the insulating member 14 of the upper electrode are formed by a ceramic material. As the ceramic material has excellent insulating, pressure-resistant, and heat-resistant properties, it can be suitably used in the connection of the lead wire 3 of the embodiment.

In the state in which the connection between the lead wire 3 and the conductive wire 5 is completed, the lead wire 3 is welded in the state of being entered into the core wires 52 of the conductive wire 5, as shown in (a) to (d) of FIG. 2 as having been described. This is because the conditions as follows are mainly satisfied: that the respective core wires 52 of the conductive wire 5 are not welded in advance, and the core wires 52 can be separated; that the spreading of the core wires 52 in the lateral direction is limited by the mounting space Ms; that a relationship between a width dimension Lw (the dimension of the cross-section in the radius direction) and a width dimension Cw of the cross-section of the conductive wire 5 is a relationship that the width dimension Lw of the lead wire 3 is smaller than the width dimension Cw of the conductive wire 5, i.e., Lw<Cw (see (b) of FIG. 2).

Under these conditions, the lead part connection method of the embodiment is characterized in being provided with the lower electrodes 11 and the upper electrodes 12, the mounting spaces Ms of the material to be welded being formed on the side of the lower electrodes 11, the material to be welded being the lead wire 3 as the lead part formed by a conductor and the conductive wire 5 where core wires formed from the core wires 52 are not integrated by welding in advance, and, in the state in which the conductive wires 5 and the lead wires 3 on the conductive wires 5 are mounted in the mounting spaces Ms, the lead wires 3 and the conductive wires 5 being pressed and heated by the lower electrodes 11 and the upper electrodes 12, and bonded through welding.

More specifically, the lead part connection method of the embodiment includes: a disposing step of disposing the conductive wires 5 where the core wires 52 are not integrated in advance on the lower electrodes 11 of the lower mold side; a mounting step of mounting the lead wires 3 on the core wires 52; a mounting space forming step of driving the lateral part guide members 15a and 15b to the side of the lower electrodes 11 to form the mounting spaces Ms; a connecting step of, in the state in which the conductive wires 5 and the lead wires 3 on the conductive wires 5 are mounted in the mounting spaces Ms, pressing and heating the conductive wires 5 and the lead wires 3 by the upper electrodes 12 of the upper mold side, and connecting the lead wires 3 and the conductive wires 5 by bonding through welding; and a take-out step of driving the upper electrodes 12 and the lateral part guide members 15a and 15b to open the mounting spaces Ms and taking out the welded lead wires 3 and conductive wires 5.

Then, the lead part connection method and the lead part connection structure according to the embodiment are described with reference to (a) and (b) of FIG. 5 and (a) and (b) of FIG. 6. (a) and (b) of FIG. 5 schematically illustrate the lead part connection method and the lead part connection structure.

Figure 5:
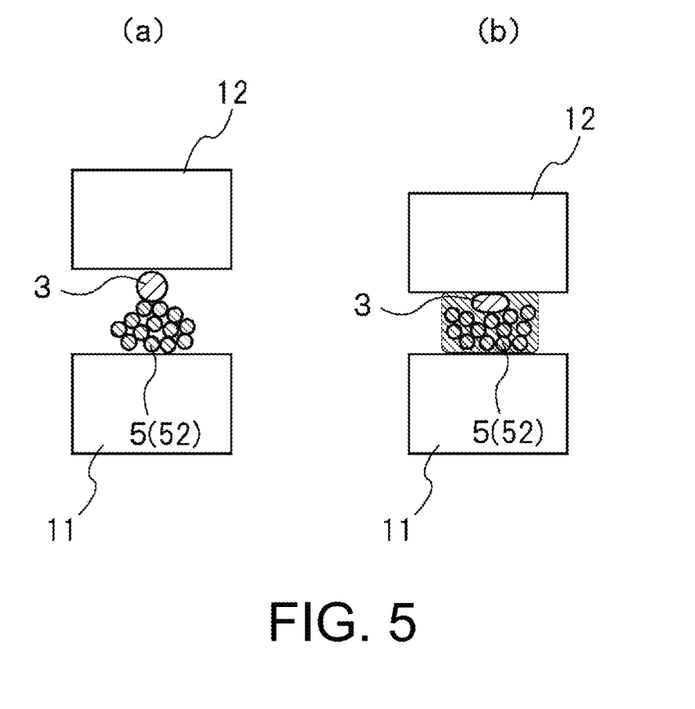
Figure 6:
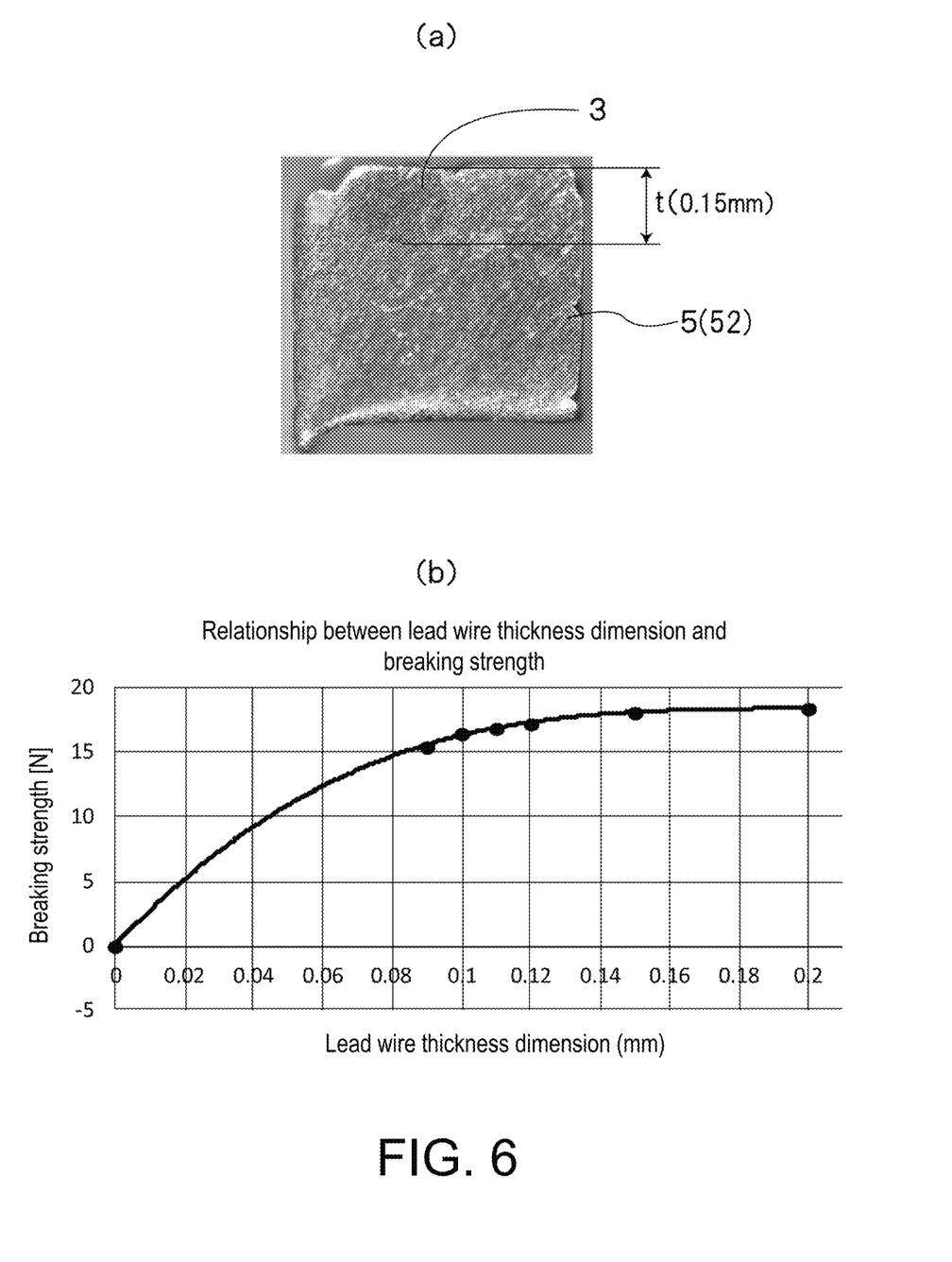

As shown in (a) of FIG. 5, the conductive wire 5 where the respective core wires 52 are not welded in advance are disposed on the side of the lower electrode 11, and the lead wire 3 is mounted on the conductive wire 5. Then, as shown in (b) of FIG. 5, the lead wire 3 and the conductive wire 5 are pressed and heated by the upper electrode 12 and bonded through welding. Therefore, one welding process is carried out.

Comparatively, in the conventional lead part connection method, the core wires in the conductive wire welded in advance to be compacted and pressed and solidified by heat molding to be integrated are disposed on the side of the lower electrode, and the lead wire is disposed on the conductive wire. Then, the lead wire and the conductive wire are pressed, heated, and bonded through welding. Therefore, two welding processes are carried out.

In this way, in the conventional art, the core wires are solidified through compacting, and the lead wire is welded thereupon. Therefore, at the time of welding the lead wire, the stress due to pressing and heating is concentrated on the lead wire, the lead wire is greatly deformed and crushed, and the damage increases. As a result, an issue that the tensile strength of the bonding part between the conductive wire and the lead wire is low arises.

Therefore, in the embodiment, the core wires 52 can be separated without being compacted through welding in advance, and the lead wire 3 is welded thereupon. Therefore, since the lead wire 3 is easily entered into the core wires 52 to be embedded by pressing at the time of welding the lead wire 3, the stress is not concentrated on the lead wire 3, but is received by a wide surface resulting from the core wires 52 and the lead wire 3. Therefore, the deformation of the lead wire 3 is reduced, and the damage can be reduced. In addition, since the damage of the lead wire 3 is reduced, and the lead wire 3 is welded in the state of being entered and embedded into the core wires 52 of the conductive wire 5, the tensile strength of the bonding part between the conductive wire 5 and the lead wire 3 is increased, and the bonding strength can be facilitated. Moreover, it can be expected that the energy of pressing and heating can be reduced at the time of welding.

(a) and (b) of FIG. 6 illustrate a relationship between a thickness dimension of the lead wire (dumet wire) and the breaking strength, where (a) of FIG. 6 is a photo illustrating the bonding part of the lead wire of the embodiment corresponding to (b) of FIG. 5, and (b) of FIG. 6 is a graph illustrating a relationship between the thickness dimension of the lead wire and the breaking strength. It is noted that a wire diameter φ0.2 is adopted for the lead wire.

As shown in (a) of FIG. 6, the deformation of the lead wire 3 is reduced and the damage is reduced, and the lead wire 3 is entered into the core wires 52 of the conductive wire 5.

Specifically, the deformation of the lead wire 3 is reduced, a thickness dimension t is about 0.15 mm, and a measurement result of tensile strength (breaking strength) indicates that a breaking strength of 18.1 N is obtained.

In addition, in (b) of FIG. 6, multiple samples of lead wires with different thickness dimensions t were prepared, and the breaking strength measurement results thereof are shown. The samples of the lead wires were pressed and crushed to change the thickness dimension t, and the breaking strength for each sample was verified in a tensile test apparatus.

The horizontal axis indicates the thickness dimension (mm) of the lead wire, and the vertical axis indicates the breaking strength (N). As shown in the graph, there is a tendency that, as the thickness dimension of the lead wire increases, the breaking strength of the bonding part increases. In other words, there is a tendency that the smaller the deformation of the thickness dimension t in the cross-section of the lead wire due to welding, the larger the breaking strength.

According to the observation based on the measurement results, as the deformation of the lead wire due to welding, it is verified that, if the thickness dimension t is 50% or less, a predetermined breaking strength can be secured. Specifically, if the wire diameter (thickness t) of the material of the lead wire is φ0.2, and the thickness t after welding is 0.1 mm or more (the deformation of the thickness t being 0.1 mm or less), the breaking strength can be secured. It is noted that such result of verification still withstands in the case where the lead part is a terminal in the second embodiment to be described afterwards.

Figure 7:
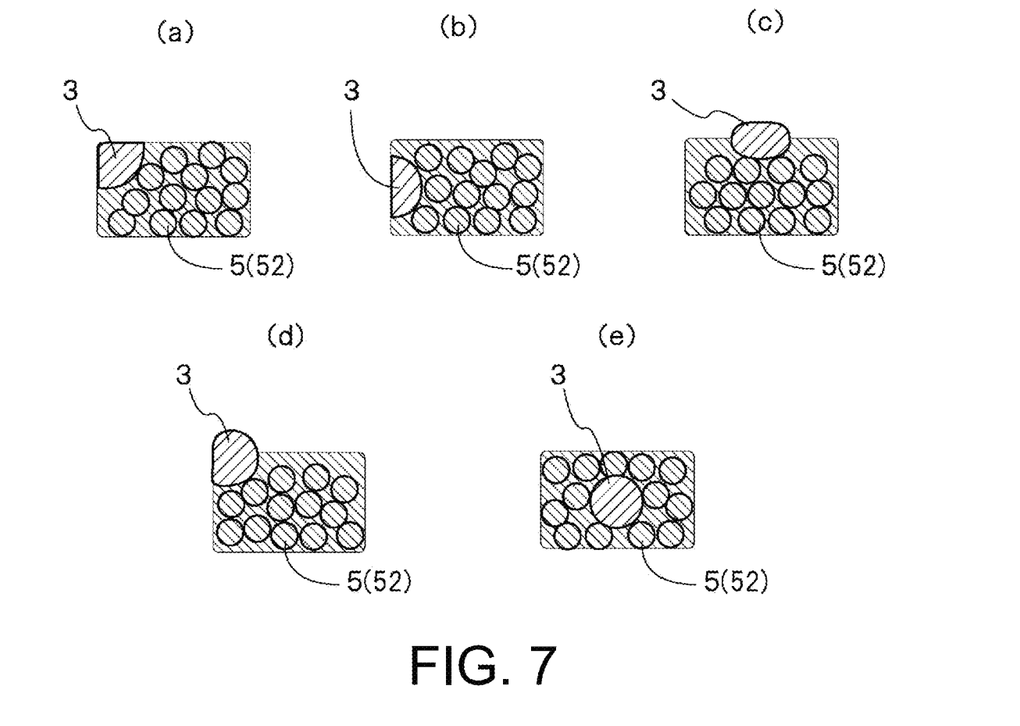

Then, with reference to (a) to (e) of FIG. 7, modified examples of the connection structure between the lead wire 3 and the conductive wire 5 are described. (a) to (e) of FIG. 7 schematically illustrate the cross-section in the state in which the lead wire 3 is entered into the core wires 52 of the conductive wire 5 in the bonding part.

(a) to (d) of FIG. 7 include the case where the lead wire 3 is mounted to be deviated with respect to the conductive wire 5, and illustrate examples of the state in which a portion of the outer periphery of the cross-section of the lead wire 3 is embedded into the core wires 52. (a) of FIG. 7 illustrates a state in which the lead wire 3 is entered into the upper side corner part of the conductive wire 5, (b) of FIG. 7 illustrates a state in which the lead wire 3 is entered into the lateral part of the conductive wire 5, (c) of FIG. 7 illustrates a state in which about a half of the lead wire 3 is entered into the upper part of the conductive wire 5, and (d) of FIG. 7 illustrates a state in which about a half of the lead wire 3 is entered into the upper side corner part of the conductive wire 5.

In addition, (e) of FIG. 7 illustrates an example of a state in which the entire periphery of the cross-section of the lead wire 3 is entered into the core wires 52. In such case, the lead wire 3 is set among the core wires 52, specifically to the substantial central part, in advance, and the lead wire 3 and the core wires 52 are disposed on the mounting surface 11a of the lower electrode 11 to be bonded.

With such connection structure of the lead wire 3, the same effect as the above embodiment can be attained.

Figure 8:
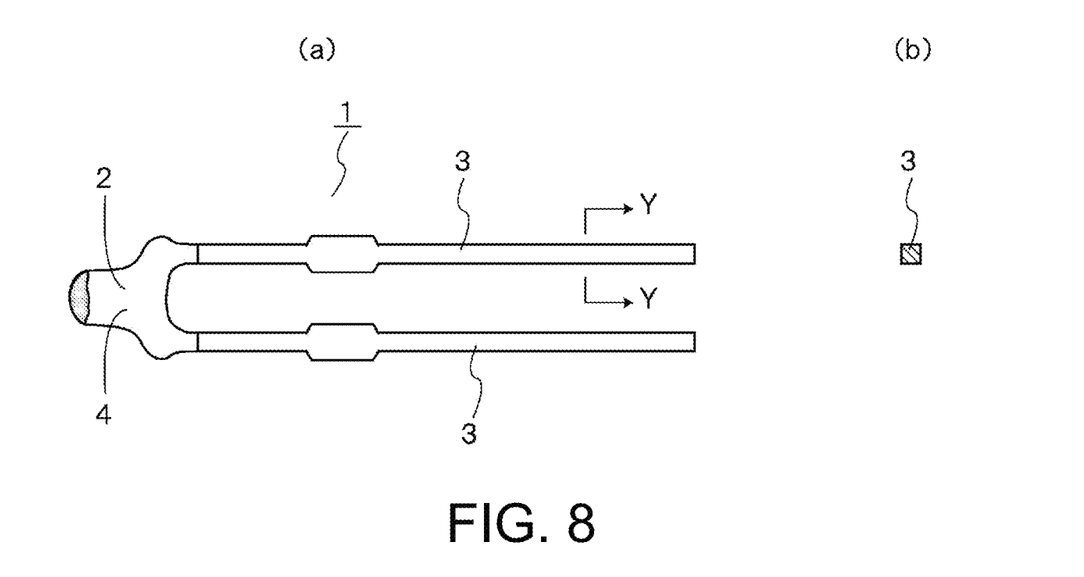
Figure 9:
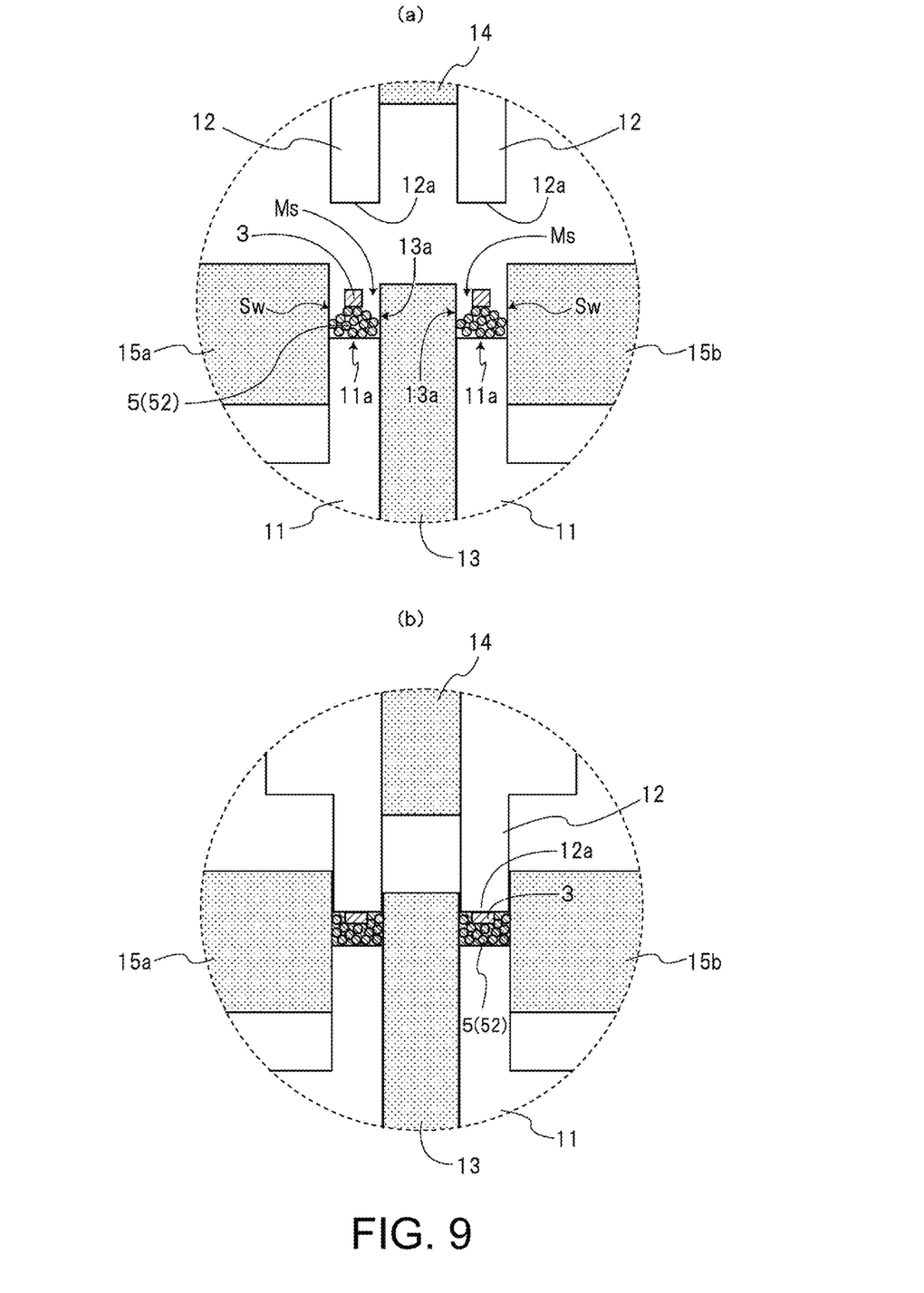
Figure 10:
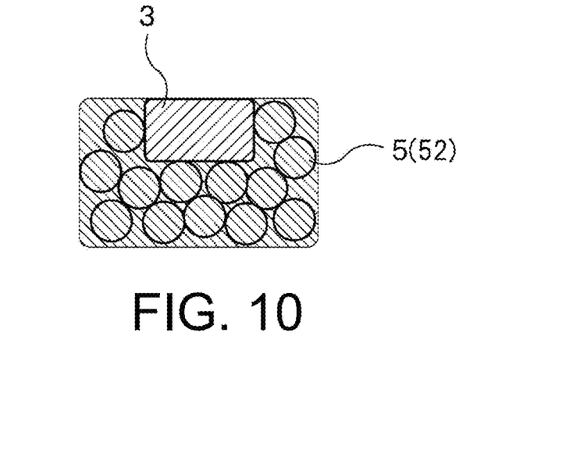
FIG. 10 is a lateral cross-sectional view illustrating the connection structure of the lead part.

In the following, an electronic component, a lead part connection structure, and a lead part connection method according to the second embodiment of the invention are described with reference to (a) and (b) of FIG. 8 and FIG. 10. In the respective figures, parts same as or equivalent to those of the first embodiment are labeled with the same reference symbols, and the descriptions thereof are not repeated. Also, in the respective figures, the scales of the respective components may be changed as appropriate for the purpose of description. (a) and (b) of FIG. 8 illustrate a temperature sensor as the electronic component, and (a) and (b) of FIG. 9 illustrate the lead part connection method. In addition, FIG. 10 schematically illustrates a cross-section of a bonding part between a lead part and a conductive wire.

The embodiment generally has the same configuration as that of the first embodiment, and a different configuration is the lead part of the temperature sensor. The lead part of the embodiment is a lead frame-like terminal.

A terminal 3 illustrated and represented in (b) of FIG. 8 is a pair of square wires in which a cross-section is in a square shape and which has a conductive property. A 42 alloy may be used in the material of the terminal 3. As the material of the terminal 3, dumet, copper (Cu), iron (Fe), chromium (Cr), nickel (Ni), aluminum (Al), zinc (Zn), titanium (Ti), or an alloy containing at least one of the aforementioned can be used.

An insulating resin, such as an epoxy resin having a high heat-resistant temperature, is used as the sealing material 4. Accordingly, even in the case of being used in a high-temperature environment, the thermistor element 2 can be effectively protected.

As shown in (a) and (b) of FIG. 9, in the embodiment, like the first embodiment, the conductive wires 5 and the terminals 3 are disposed on the side of the lower electrodes 11 forming the lower mold, and are pressed and welded by the side of the upper electrodes 12 forming the upper mold.

As shown in (a) and (b) of FIG. 9, the conductive wires 5 where the respective core wires 52 are not welded in advance are disposed on the mounting surfaces 11a of the lower electrodes 11. Then, the terminals 3 are mounted on the core wires 52. Then, the lateral part guide members 15a and 15b and the upper electrodes 12 are driven, and the terminals 3 and the conductive wires 5 are pressed and heated by the upper electrodes 12 and bonded by welding. In such case, the core wires 52 of the conductive wire 5 disposed in the mounting space Ms are in the state that can be separated. However, the spreading in the lateral direction is limited by the width dimension of the mounting space Ms. In addition, it is needless to say that the width dimension of the mounting space Ms is greater than the width dimension of the cross-section of the terminal 3.

As shown in FIG. 10, in the state in which the connection between the terminal 3 and the conductive wire 5 is completed, the terminal 3 is in the state of being entered into the core wires 52 of the conductive wire 5 and welded. This is because the conditions as follows are mainly satisfied: that the respective core wires 52 of the conductive wire 5 are not welded in advance, and the core wires 52 can be separated; that the spreading of the core wires 52 in the lateral direction is limited by the mounting space Ms; and that a relationship between the width dimension of the terminal 3 and the width dimension of the conductive wire 5 is a relationship that the width dimension of the terminal 3 is smaller than the width dimension of the conductive wire 5.

According to the embodiment as described above, the same effect as the first embodiment can be attained. That is, the core wires 52 are not compacted by welding in advance and can be separated, and the lead wire 3 is welded thereupon. Therefore, since the terminal 3 is easily entered to be embedded into the core wires 52, the stress is not concentrated on the terminal 3, and the damage to the terminal 3 can be reduced. In addition, since the terminal 3 is welded in the state of being embedded and entered into the core wires 52 of the conductive wire 5, the tensile strength of the bonding part between the conductive wire 5 and the terminal 3 is increased, and the bonding strength can be facilitated.

Figure 11:
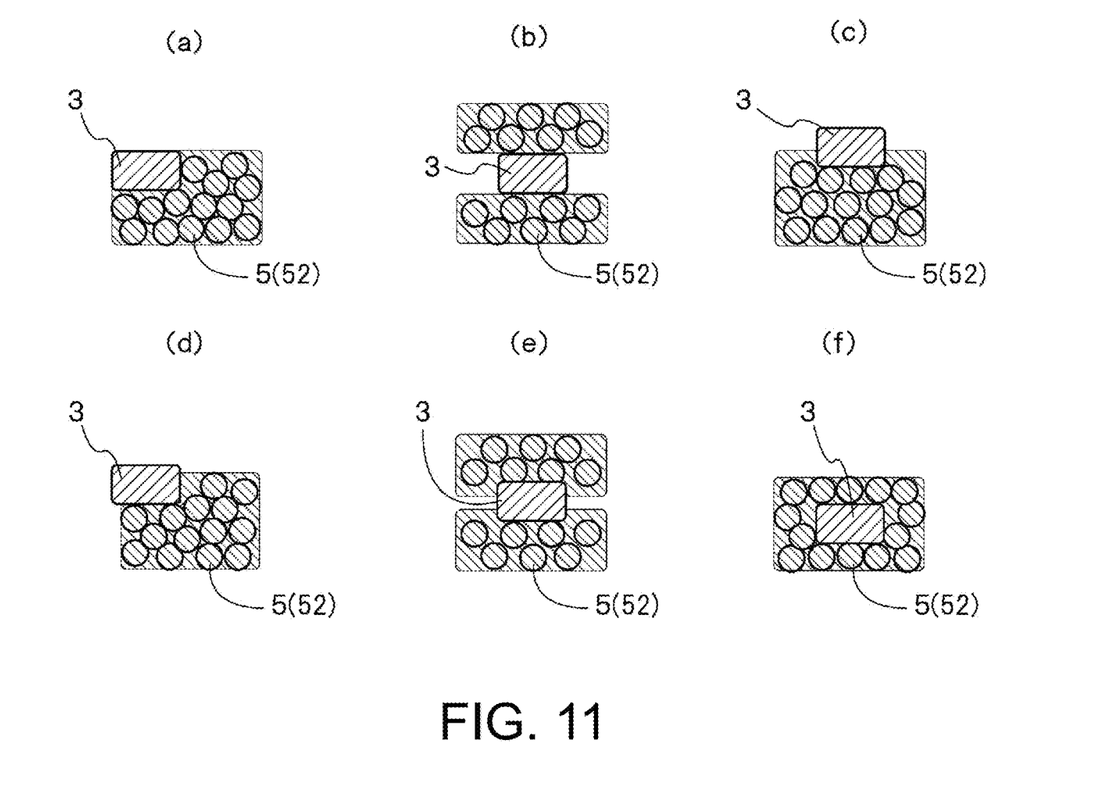
Figure 12:
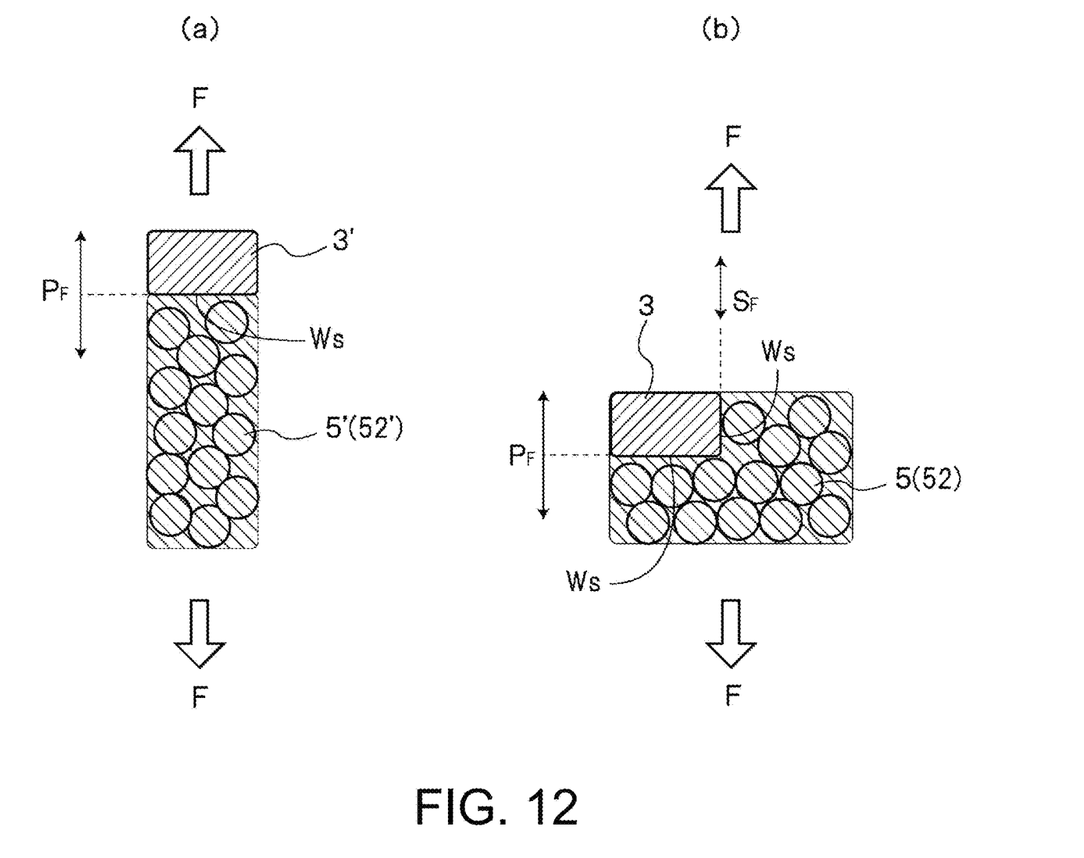

Then, with reference to (a) to (f) of FIG. 11 and (a) and (b) of FIG. 12, modified examples of the connection structure between the terminal 3 and the conductive wire 5 are described. (a) to (f) of FIG. 11 schematically illustrate the cross-section of the state in which the terminal 3 is entered into the core wires 52 of the conductive wire 5 in the bonding part, and (a) and (b) of FIG. 12 are views illustrating a connection structure of the terminal as the lead part of the embodiment in comparison with a comparative example.

(a) to (e) of FIG. 11 illustrate examples of the state in which a portion of the outer periphery of the cross-section of the terminal 3 is embedded into the core wires 52.

(a) of FIG. 11 illustrates a state in which the terminal 3 is entered into the upper side corner part of the conductive wire 5, (b) of FIG. 11 illustrates a state in which the terminal 3 is entered into the conductive wires 5 so as to be sandwiched between the conductive wires 5 disposed in a top-down arrangement, (c) of FIG. 11 illustrates a state in which about a half of the terminal 3 is entered into the upper part of the conductive wire 5, (d) of FIG. 11 illustrates a state in which about over a half of the terminal 3 is entered into the upper side corner part of the conductive wire 5, and (e) of FIG. 11 illustrates a state in which the terminal 3 is embedded and entered into the conductive wires 5 so as to be sandwiched between the conductive wires 5 disposed in a top-down arrangement.

In addition, (f) of FIG. 11 illustrates an example of a state in which the entire periphery of the cross-section of the terminal 3 is entered into the core wires 52. In such case, the terminal 3 is set among the core wires 52 in advance, and the terminal 3 and the core wires 52 are disposed on the mounting surface 11a of the lower electrode 11 to be bonded.

As described above, in the example (including the example shown in FIG. 10 of the embodiment), in the terminal 3 whose cross section is in a square shape, multiple surfaces, that is, at least two or more surfaces, serve as welding surfaces Ws with the core wires 52 in the conductive wire 5.

In addition, regarding the connection structures of the comparative example and the embodiment shown in (a) and (b) of FIG. 12, in the comparative example shown in (a) of FIG. 12, a conductive wire 5' and a terminal 3' are formed with the same width dimension. Therefore, there is only one welding surface Ws.

Meanwhile, in the embodiment shown in (b) of FIG. 12, an example (the type shown in (a) of FIG. 11) is illustrated as an example. In the embodiment, two surfaces on the bottom surface side and a lateral surface side serve as the welding surfaces Ws.

Therefore, when an external force F in the vertical direction is applied to the bonding part of the terminal 3, in the comparative example, an issue that it is weak against a force $P_F$ in a peeling direction and vulnerable to peeling arises. Comparatively, in the embodiment, the effects that the external force F in the vertical direction is separated into the force $P_F$ in the peeling direction and a force $S_F$ in a shearing direction and that the peeling-resistant property can be facilitated can be attained. In addition, in the case where the cross-sectional areas of the conductive wires 5 and 5' in the embodiment and the comparative example are constant, the height dimension of the embodiment can be reduced with respect to the comparative example.

According to the respective embodiments having been described above, the damage to the lead part (the lead wire 3, the terminal 3) can be reduced, and the bonding strength between the lead part and the conductive wire 5 can be facilitated. In addition, the height of the temperature sensor 1 can be reduced.

Figure 13:
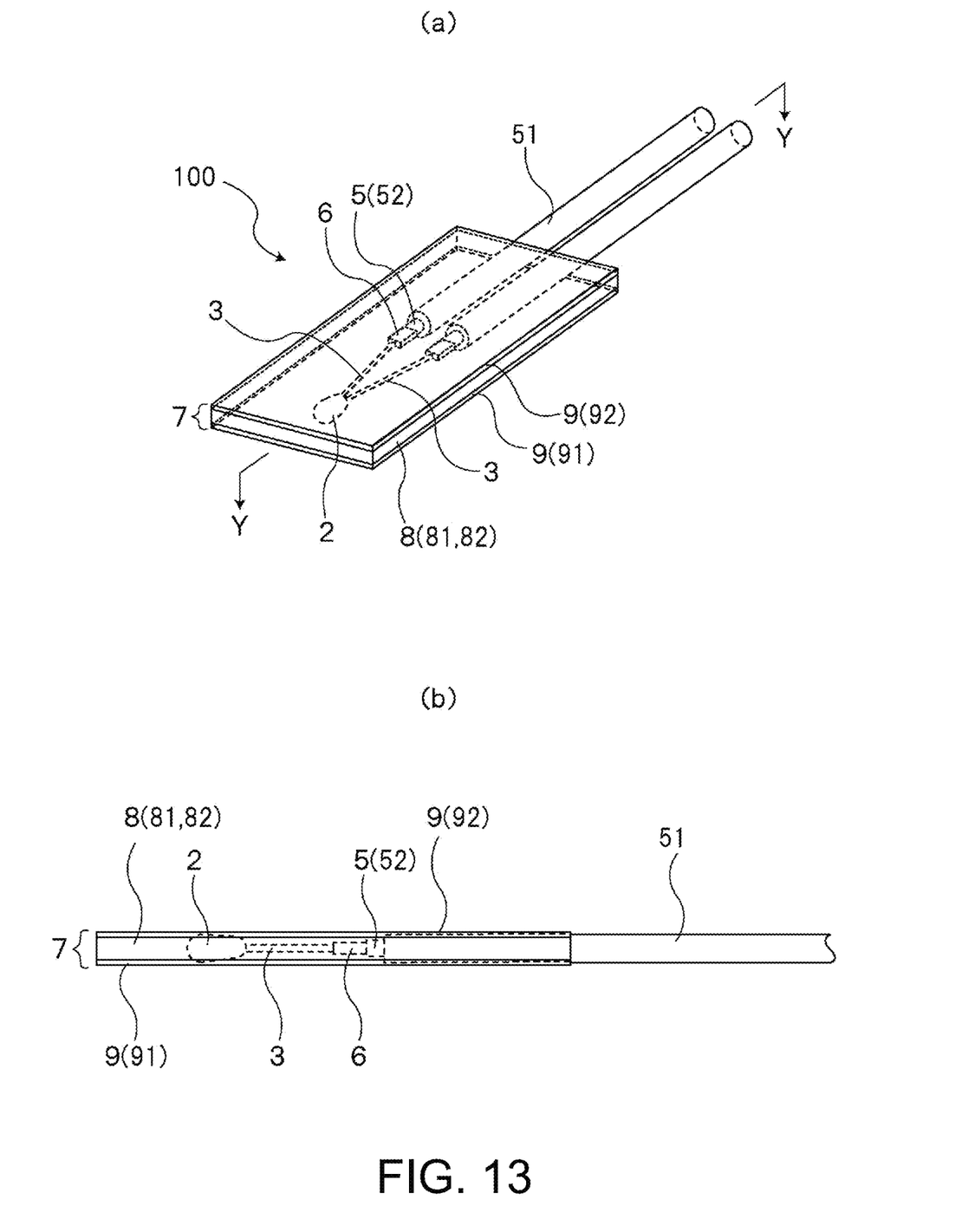

Then, a temperature sensor 100 as an electronic component having the lead part connection structure according to the first embodiment is described with reference to (a) and (b) of FIG. 13. In the temperature sensor 100, a cover layer 7 covers the thermistor element 2 and the lead wires 3, including the bonding parts 6 between the lead wires 3 and the conductive wires 5.

That is, the cover layer 7 covers the thermistor element 2 and a part of the lead part connection structure. Specifically, the cover layer 7 has an insulating property and covers the lead wire 3 and the bonding part 6 between the lead wire 3 and the conductive wire 5, and has a function of protecting the lead wire 3 and the bonding part 6 from the surrounding environment. The cover layer 7 is formed by a resin material, such as a fluororesin, and is formed from an inner layer 8 and an outer layer 9.

Specifically, the inner layer 8 is formed by a fluororesin FEP (fluororesin that is a combination of tetrafluoroethylene and hexafluoropropylene), and covers the thermistor element 2, etc., in a state in which FEP is melted and solidified.

The inner layer 8 is a layer formed by heating, melting, and then solidifying a pair of sheet-like resin materials (a first inner layer material 81, a second inner layer material 82). The inner layer 8 is originally a pair of (two) sheet-like resin materials, and is then melted and integrated to form a single layer. The thickness dimension of the inner layer 8 is about 1 mm to 1.25 mm.

The outer layer 9 is formed by a pair of sheet-like resin materials, such as a fluororesin PTFE (ethylene tetrafluoride), and has a first outer layer material 91 and a second outer layer material 92. The first outer layer material 91 and the second outer layer material 92 are formed with a flat surface in a substantially rectangular shape. The length dimension thereof is about 22 mm, the width dimension thereof is about 6.6 mm, and the thickness dimension thereof is about 0.25 mm.

Therefore, compared with the thickness dimension of the inner layer 8 being about 1 mm to 1.25 mm, the thickness dimension of the outer layer 9 is: 0.25 mm*2=0.5 mm, and the thickness dimension of the inner layer 8 is greater than the thickness dimension of the outer layer 9.

In the configuration as the above, the thermistor element 2 covered by the inner layer 8, the lead wire 3, and the bonding part 6 between the lead wire 3 and the conductive wire 5 are further covered by the outer layer 9. In this case, in the state in which the lead wire 3 is entered into the core wires 52 of the conductive wire 5, the lead wire 3 and the conductive wire 5 are connected by welding and the bonding part 6 is formed. Therefore, the thickness of the bonding part 6 can be reduced. As a result, the thickness dimension of the temperature sensor 100 covered by the cover layer 7 is reduced, and the temperature measurement accuracy and the responsiveness of the temperature sensor 100 can be facilitated.

It is noted that, since the conductive wire 5 is connected with a temperature measurement circuit not shown herein, the conductive wire 5 is exposed from an end side of the cover layer 7 to be led out. Therefore, the temperature of an object under temperature measurement can be sensed by the temperature measurement circuit based on the resistance variation of the thermistor element 2.

In this way, the temperature sensor 100 is attached to the object under temperature measurement to carry out temperature sensing. The object under temperature measurement is a heat source, and a plate-like portion of the heat source is brought into contact with the surface of the temperature sensor 100 to carry out temperature sensing. The surfaces of the first outer layer material 91 and the second outer layer material 92 are flat, and the side of the first outer layer material 91 or the second outer layer material 92 is set as a temperature sensing surface and brought into contact with the object under temperature measurement to carry out temperature sensing.

The temperature sensor 100 is thinned and provided with a flat temperature sensing surface, and can be brought into contact with the object under measurement in a broad contact area. The heat from the object under measurement can be favorably transferred to the temperature sensor 100. The temperature sensor 100 can be expected to have a quick heat responsiveness and facilitated measurement accuracy. Also, the cover layer 7 may also be provided in the lead part connection structure according to the second embodiment like the above.

The invention is not limited to the configuration of each of the above embodiments, and various modifications can be made without departing from the gist of the invention. Further, the above embodiments are presented as examples, and are not intended to limit the scope of the invention. These novel embodiments can be implemented in a variety of other forms and various omissions, replacements, and changes can be carried out. These embodiments and modifications thereof are included in the scope and gist of the invention, and are also included in the scope of the invention described in the claims and the equivalent scope thereof.

What is claimed is:

1. A lead part connection structure, connecting a lead part formed by a conductor and a conductive wire formed by a plurality of core wires by welding,
   wherein the lead part and the conductive wire are connected by welding in a state in which the lead part is entered into the core wires of the conductive wire,
   wherein a deformation of a thickness dimension of a cross-section of the lead part due to welding between the lead part and the conductive wire is 50% or less.

2. The lead part connection structure as claimed in claim 1, wherein in the conductive wire, the core wires are not integrated by welding in advance.

3. The lead part connection structure as claimed in claim 1, wherein the state in which the lead part is entered into the core wires of the conductive wire is a state in which a portion or an entirety of an outer periphery of a cross-section of the lead part is entered into the core wires of the conductive wire.

4. The lead part connection structure as claimed in claim 1, wherein the lead part is a lead wire whose cross-section is in a circular shape or a terminal whose cross-section is in a square shape.

5. The lead part connection structure as claimed in claim 1, wherein the lead part is a terminal whose cross-section is in a square shape, and a plurality of surfaces of the terminal serve as welding surfaces with the conductive wire.

6. An electronic component, comprising an electronic component element and the lead part connected with the electronic component element,
wherein the electronic component has the lead part connection structure as claimed in claim 1.

7. The electronic component as claimed in claim 6, wherein the electronic component element is a thermistor element.

8. The electronic component as claimed in claim 6, comprising a cover layer having an insulating property and covering the electronic component element and the lead part connection structure.

9. A lead part connection method adapted for a resistance welding apparatus, wherein the resistance welding apparatus includes a lower electrode and an upper electrode, a mounting space of a material to be welded is formed on a side of the lower electrode, and the material to be welded is a lead part formed by a conductor and a conductive wire formed from a plurality of core wires, the core wires not being integrated by welding in advance, the lead part connection method comprising:
in a state in which the conductive wire and the lead part on or in the conductive wire are mounted in the mounting space, pressing and heating only the lead part and the conductive wire from above and below by using the lower electrode and the upper electrode so as to bond the lead part and the conductive wire through welding.

10. The lead part connection method as claimed in claim 9, wherein a width dimension of the cross-section of the lead part is smaller than a width dimension of the conductive wire.

11. The lead part connection method as claimed in claim 9, wherein the mounting space is configured to limit spreading of the core wires in the conductive wire in a lateral direction.

* * * * *